US010020229B2

(12) United States Patent
Bi et al.

(10) Patent No.: US 10,020,229 B2
(45) Date of Patent: Jul. 10, 2018

(54) FIN TYPE FIELD EFFECT TRANSISTORS WITH DIFFERENT PITCHES AND SUBSTANTIALLY UNIFORM FIN REVEAL

(71) Applicant: INTERNATIONAL BUSINESS MACHINES CORPORATION, Armonk, NY (US)

(72) Inventors: Zhenxing Bi, Niskayuna, NY (US); Kangguo Cheng, Schenectady, NY (US); Thamarai S. Devarajan, Albany, NY (US); Balasubramanian Pranatharthiharan, Watervliet, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/487,685

(22) Filed: Apr. 14, 2017

(65) Prior Publication Data

US 2017/0263503 A1 Sep. 14, 2017

Related U.S. Application Data

(62) Division of application No. 15/063,735, filed on Mar. 8, 2016, now Pat. No. 9,691,765.

(51) Int. Cl.
*H01L 21/8234* (2006.01)
*H01L 27/088* (2006.01)
(Continued)

(52) U.S. Cl.
CPC ........ *H01L 21/823431* (2013.01); *H01L 21/02274* (2013.01); *H01L 21/31111* (2013.01);
(Continued)

(58) Field of Classification Search
CPC .......... H01L 27/0886; H01L 21/02274; H01L 21/3111; H01L 21/823431; H01L 21/823481; H01L 27/0207
See application file for complete search history.

(56) References Cited

U.S. PATENT DOCUMENTS 7,960,791 B2 6/2011 Anderson et al.
8,440,517 B2 5/2013 Lin et al.
(Continued)

OTHER PUBLICATIONS

List of IBM Patents or Patent Applications Treated as Related dated Apr. 14, 2017, 2 pages.
(Continued)

*Primary Examiner* — Dung Le
(74) *Attorney, Agent, or Firm* — Tutunjian & Bitetto, P.C.; Jennifer Davis

(57) ABSTRACT

A semiconductor device that includes a first plurality of fin structures in a first device region and a second plurality of fin structures in a second device region. The first plurality of fin structures includes adjacent fin structures separated by a lesser pitch than the adjacent fin structures in the second plurality of fin structures. At least one layer of dielectric material between adjacent fin structures, wherein a portion of the first plurality of fin structures extending above the at least one layer of dielectric material in the first device region is substantially equal to the portion of the second plurality of fin structures extending above the at least one layer of dielectric material in the second device region. Source and drain regions are present on opposing sides of a gate structure that is present on the fin structures.

20 Claims, 15 Drawing Sheets

(51) Int. Cl.
- *H01L 21/02* (2006.01)
- *H01L 21/311* (2006.01)
- *H01L 29/06* (2006.01)
- *H01L 27/02* (2006.01)
- *H01L 21/762* (2006.01)
- *H01L 21/8238* (2006.01)
- *H01L 27/092* (2006.01)

(52) U.S. Cl.
CPC ........... *H01L 21/76229* (2013.01); *H01L 21/823481* (2013.01); *H01L 21/823821* (2013.01); *H01L 21/823878* (2013.01); *H01L 27/0207* (2013.01); *H01L 27/0886* (2013.01); *H01L 27/0924* (2013.01); *H01L 29/0649* (2013.01); *H01L 21/823412* (2013.01)

(56) References Cited

U.S. PATENT DOCUMENTS

| | | |
|---|---|---|
| 8,541,286 B2 | 9/2013 | Park |
| 8,785,284 B1 | 7/2014 | Bergendahl et al. |
| 8,916,950 B2 | 12/2014 | Kim et al. |
| 9,123,771 B2 | 9/2015 | Shen et al. |
| 2014/0252497 A1 | 9/2014 | Peng et al. |
| 2014/0306317 A1 | 10/2014 | Licausi |
| 2015/0021690 A1 | 1/2015 | Jacob et al. |

OTHER PUBLICATIONS

Du, L. et al., "Optimization of STI Oxide Recess Uniformity for FinFET Beyond 20nm" Semiconductor Technology International Conference (CSTIC) (Mar. 2015) pp. 1-4.

FIN TYPE FIELD EFFECT TRANSISTORS WITH DIFFERENT PITCHES AND SUBSTANTIALLY UNIFORM FIN REVEAL

BACKGROUND

Technical Field

The present disclosure relates to semiconductor devices, and more particularly to semiconductors including fin structures.

Description of the Related Art

With the continuing trend towards miniaturization of integrated circuits (ICs), there is a need for transistors to have higher drive currents with increasingly smaller dimensions. The use of non-planar semiconductor devices such as, for example, silicon fin field effect transistors (FinFETs) may be the next step in the evolution of complementary metal oxide semiconductor (CMOS) devices.

SUMMARY

In one embodiment, a method of forming fin structures is provided that includes forming a first plurality of fin structures in a first region of a substrate and a second plurality of fin structures in a second region of a substrate, wherein a first dielectric material is present between adjacent fin structures in the first plurality and second plurality of fin structures. The first plurality of fin structures has a tighter pitch than the second plurality of fin structures. The first dielectric material is recessed so that a first portion of the dielectric material present between the fin structures in the first plurality of fin structures is vertically offset from a second portion of the first dielectric material present between the fin structures in the second plurality of fin structures. A first conformal etch stop layer is deposited on exposed surfaces of the first plurality of fin structures and the second plurality of fin structures as well as the offset upper surfaces of the first and second portions of the first dielectric material. A second dielectric material is deposited atop the first conformal etch stop layer, wherein a portion of the second dielectric material present in the second region of the substrate has an upper surface substantially coplanar with an upper surface of the first conformal etch stop layer in the first region of the substrate. A second conformal etch stop layer is formed on the \ second dielectric material. At least one third dielectric material layer is formed on the second conformal etch stop layer. The at least one third dielectric material is recessed using an etch that is selective to the first conformal etch stop layer and the second conformal etch stop layer, wherein a portion of the fin structures in the first plurality of fin structures that is revealed by the recess etch is substantially equal to a portion of the fin structures in the second plurality of fin structures that is revealed by the recess etch.

In another aspect of the present disclosure, a method of forming semiconductor devices is provided. The method may include providing a first plurality of fin structures in a first region of a substrate having a first portion of a first dielectric material having a first height present between adjacent fin structures in the first region, and a second plurality of fin structures in a second region of the substrate having a second portion of the first dielectric material having a second height present between adjacent fin structure in the second region. A first etch stop layer is deposited on the first plurality of fin structures and the second plurality of fin structures as well as offset upper surfaces of the first and second height of the first dielectric material. A second dielectric material is deposited atop the first etch stop layer, wherein a portion of the second dielectric material present in the second region of the substrate has an upper surface substantially coplanar with an upper surface of the first conformal etch stop layer in the first region of the substrate. A second conformal etch stop layer is formed on the second dielectric material, wherein a portion of the second etch stop layer in the second region is substantially coplanar with a portion of the first etch stop layer in the first region. At least one third dielectric material layer is formed on the second conformal etch stop layer. The at least one third dielectric material is recessed using an etch that is selective to the first etch stop layer and the second etch stop layer, wherein a portion of the fin structures in the first plurality of fin structures that is revealed by the recess etch is substantially equal to a portion of the fin structures in the second plurality of fin structures that is revealed by the recess etch. A gate structure and source and drain regions are formed on said first and second plurality of fin structures.

In another aspect of the present disclosure, a semiconductor device is provided. The semiconductor device comprises a first plurality of fin structures in a first device region and a second plurality of fin structures in a second device region. The first plurality of fin structures includes adjacent fin structures separated by a lesser pitch than the adjacent fin structures in the second plurality of fin structures. At least one layer of dielectric material is present between said adjacent fin structures in the first plurality of fin structures in the first device region and the second plurality of fin structures in the second device region. The portion of the first plurality of fin structures extending above the at least one layer of dielectric material in the first device region is substantially equal to the portion of the second plurality of fin structures extending above the at least one layer of dielectric material in the second device region. A gate structure is present on a channel region of at least one of said first plurality of fin structures and at least one of said second plurality of fin structures. Source and drain regions are present on opposing sides of said gate structure.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION

Figure 1:
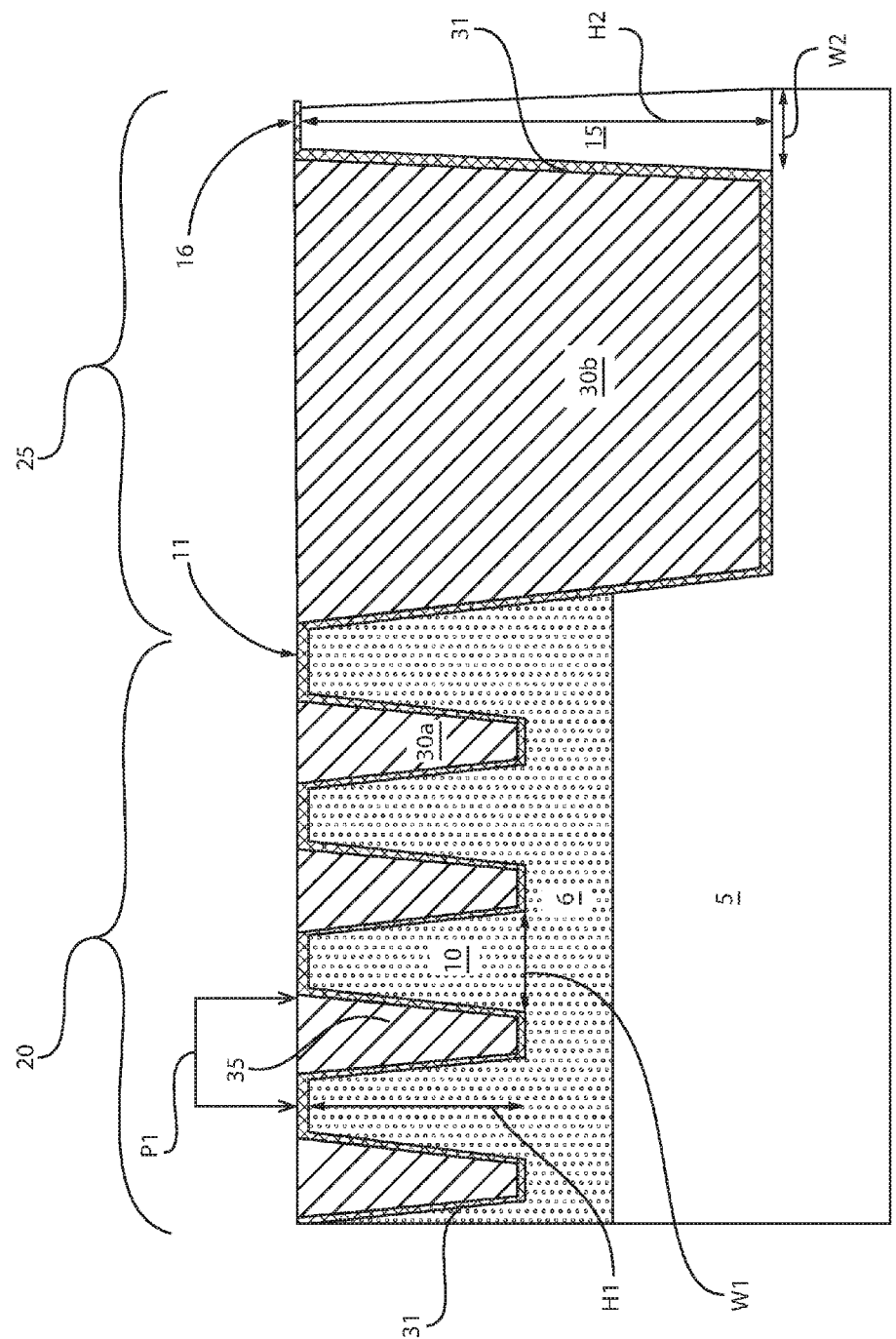
FIG. 1 is a side cross-sectional view depicting a first plurality of fin structures in a first device region and a second plurality of fin structures in a second device region, in which the first plurality of fin structures has a tighter pitch than the second plurality of fin structures, in accordance with one embodiment of the present disclosure.

Detailed embodiments of the claimed methods and structures are disclosed herein; however, it is to be understood that the disclosed embodiments are merely illustrative of the claimed structures and methods that may be embodied in various forms. In addition, each of the examples given in connection with the various embodiments is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. For purposes of the description hereinafter, the terms "upper", "over", "overlying", "lower", "under", "underlying", "right", "left", "vertical", "horizontal", "top", "bottom", and derivatives thereof shall relate to the embodiments of the disclosure, as it is oriented in the drawing figures. The term "positioned on" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The structures and methods that are disclosed herein provide etch stop layers that are positioned to control the amount, i.e., height, of fin structures that extends above the dielectric material that isolates adjacent fin structures from one another, in which the fin structures include a first plurality having a first pitch and a second plurality having a second pitch, in which the first pitch is tighter than the second pitch.

In FINFET technology, Fin reveal can be an important step which defines the Fin height. The micro-loading effects that result from increases scaling of FinFET devices can lead to FIN reveal variation between patterning dense and isolated features on FinFET device. Insufficient and/or excessive FIN reveal can impact device yield and device step-up for FinFET structures. In some scenarios, there is an eager demand for alleviating Fin reveal variation at various device/pattern density areas.

The methods and structures disclosed herein resolve the issues of having non-uniform Fin reveal between patterning dense and isolated device areas. In some embodiments, the etch stop layers used to control the fin reveal includes a first etch stop layer, e.g., a nitride liner deposited by plasma enhanced chemical vapor deposition or high density plasma chemical vapor deposition, atop the STI region that helps to define the FIN height of the fin structures having the tighter pitch, i.e., the dandified device area, in which the first etch stop layer can also provide a mechanism for interlevel dielectric layer (ILD) oxide recess stop control in downstream process steps. In some embodiments, a second etch stop layer, which may be referred to as an embedded nitride liner deposited by plasma enhanced chemical vapor deposition (PECVD), is present in the isolated area and provides interlevel dielectric layer (ILD) oxide recess stop control in the region of the substrate having the large features with the great pitch dimension separating adjacent fin structures. The aforementioned first and second etch stop layers help minimize the FIN Reveal variations that typically occur in prior process flows that include fin structures having density variations, i.e., variations in fin pitch. In some embodiments, a similar integration scheme could be applied multiply to eliminate the macro to macro fin reveal variations due to various pattern densities. Further details regarding the method and structures of the present disclosure are now described with reference to FIGS. 1-15.

FIG. 1 depicts a first plurality of fin structures 10 in a first device region 20 and a second plurality of fin structures 15 in a second device region 25, in which the first plurality of fin structures 10 has a tighter pitch P1 than the second plurality of fin structures 15. As used herein, the term "fin structure" refers to a semiconductor material, which can be employed as the body of a semiconductor device, in which the gate structure is positioned around the fin structure such that charge flows down the channel on the two sidewalls of the fin structure and optionally along the top surface of the fin structure. The fin structures 10, 15 present in the first and second device regions 20, 25 are processed to provide FinFETs. A field effect transistor (FET) is a semiconductor device in which output current, i.e., source-drain current, is controlled by the voltage applied to a gate structure to the channel of a semiconductor device. A finFET is a semiconductor device that positions the channel region of the semiconductor device in a fin structure. As used herein, the term "drain" means a doped region in semiconductor device located at the end of the channel region, in which carriers are flowing out of the transistor through the drain. The term "source" is a doped region in the semiconductor device, in which majority carriers are flowing into the channel region. The source and drain regions of a finFET are typically formed on source and drain portions of the fin structures that are on opposing sides of the portion of the fin structure containing the channel region. In some examples, epitaxial semiconductor material provides portions of the source and drains regions of the FinFET, in which the epitaxial semiconductor material is formed on a portion of the source and drain portions of the fin structure.

The semiconductor material that provides the fin structures 10, 15 may be a semiconducting material including, but not limited to silicon, strained silicon, a silicon carbon alloy (e.g., silicon doped with carbon (Si:C), silicon germanium, a silicon germanium and carbon alloy (e.g., silicon germanium doped with carbon (SiGe:C), silicon alloys, germanium, germanium alloys, gallium arsenic, indium arsenic, indium phosphide, as well as other III/V and II/VI compound semiconductors. In one example, the fin structures 10 that are present in the first device region 20 are composed of a different semiconductor material than the fin structures 15 that are present in the second device region 25. In another example, the fin structures 10 that are present in the first device region 20 are composed of the same semiconductor material that the fin structures 15 that are present in the second device region 25 are composed of.

The plurality of fin structures 10 may be formed from a semiconductor substrate 5, using deposition photolithography and etch processes. In the example, in which the substrate 5 is a bulk substrate, an upper portion of the substrate 5 may be provide the material for the second plurality of fin structures 15 that are defined by etching. The first plurality of the fin structures 10 may be provided may a semiconductor material layer 6 that is present on the upper surface of the semiconductor substrate 5. The semiconductor material layer 6 may be composed of the same or a different composition as the substrate 5. In some embodiments, when the semiconductor material layer 6 is composed of a different composition as the substrate 5, the composition of the semiconductor material 6 may be selected to provide a strain that results from a difference in lattice dimension between an epitaxially formed semiconductor material layer 6 and the semiconductor substrate 5. For example, when the first region of the substrate 20 is processed to provide p-type FinFETs, the semiconductor material layer 6 can be selected to be composed of silicon germanium or germanium epitaxially grown on a silicon substrate to produce an intrinsic compressive stress that produces carrier speed enhancements in p-type semiconductor devices. In another example, when the first region of the substrate 20 is processed to provide n-type FinFETs, the semiconductor material layer 6 can be selected to be composed of silicon doped with carbon epitaxially grown on a silicon substrate to produce an intrinsic tensile stress that produces carrier speed enhancements in n-type semiconductor devices.

The fin structures 10, 15 are typically formed using deposition, photolithography, i.e., patterning, and etch processes. In one embodiment, the patterning process used to define each of the fin structures 10, 15 is a sidewall image transfer (SIT) process. The SIT process can include forming a first mandrel material layer (not shown) on the material layer that provides the fin structures 10, 15, such as upper surface of the substrate 5 and the semiconductor material layer 6. The first mandrel material layer can include any material (semiconductor, dielectric or conductive) that can be selectively removed from the structure during a subsequently performed etching process. In one embodiment, the first mandrel material layer may be composed of amorphous silicon or polysilicon. In another embodiment, the first mandrel material layer may be composed of a metal, such as, e.g., aluminum (Al), tungsten (W), or copper (Cu). The first mandrel material layer can be formed by a deposition method, such as chemical vapor deposition or plasma enhanced chemical vapor deposition. In one embodiment, the thickness of the first mandrel material layer can be from 50 nm to 300 nm. Following deposition of the first mandrel material layer, the first mandrel material layer can be patterned by lithography and etching to form a plurality of first mandrel structures on the topmost surface of the semiconductor containing material that provides the fin structures 10, 15 e.g., the upper surface of the substrate 5 or the upper surface of the semiconductor material layer 6.

In some embodiments, the SIT process may continue by forming a dielectric spacer on each sidewall of each of the first mandrel structures. The dielectric spacer can be formed by deposition of a dielectric spacer material, and then etching the deposited dielectric spacer material. The dielectric spacer material may comprise any dielectric spacer material such as, for example, silicon dioxide, silicon nitride or a dielectric metal oxide. Examples of deposition processes that can be used in providing the dielectric spacer material include, but are not limited to, chemical vapor deposition (CVD), plasma enhanced chemical vapor deposition (PECVD), or atomic layer deposition (ALD). Examples of etching that be used in providing the dielectric spacers include any etching process such as, e.g., reactive ion etching (RIE). Since the dielectric spacers are used in the SIT process as an etch mask, the width of the each dielectric spacer determines the width of each fin structure 10, 15.

In some embodiments, after formation of the dielectric spacers, the SIT process continues by removing each the first mandrel structure. Each of the first mandrel structures can be removed by an etching process that is selective for removing the mandrel material as compared to semiconductor material of the substrate 5 or the semiconductor material layer 6 that provides the fin structures 10, 15, e.g., silicon (Si). Following the first mandrel structure removal, the SIT process continues by transferring the pattern provided by the dielectric spacers into the semiconductor material layer that provides the fin structures 10, 15. The pattern transfer may be achieved by utilizing at least one etching process that can include dry etching, such as reactive ion etching (RIE), plasma etching, ion beam etching or laser ablation, chemical wet etch processes or a combination thereof. In one example, the etch process used to transfer the pattern may include one or more reactive ion etching (RIE) steps. Following etching, i.e., pattern transfer, the SIT process may conclude with removing the dielectric spacers using an etch process or a planarization process.

In some embodiments, the fin structures 10 in the first plurality of fin structures 10 are grouped in a denser, i.e., tighter pitch arrangement, than the fin structures 15 in the second plurality of fin structures 15. As used herein, the "pitch" is the center to center distance separating adjacent fin structures having a parallel length.

The height H1 of the fin structures in the first plurality of fin structures 10 is measured from the upper surface of the portions of the semiconductor material layer 6 that have been recessed, and the height of the fin structures in the first plurality of fin structures 10 is generally less than the height of the fin structures in the second plurality of fin structures 20. In one embodiment, each of the plurality of fin structures 10 has a height H1 ranging from 10 nm to 100 nm. In one example, each of the plurality of fin structures 10 has a height H1 ranging from 20 nm to 50 nm. Each of the plurality of fin structures 10 may have a width W1 of less than 20 nm. In another embodiment, each of the plurality of fin structures 10 has a width W1 ranging from 3 nm to 8 nm. Although four fin structures are depicted in FIG. 1, the present disclosure is not limited to only this example. It is noted that any number of fin structures 10 may be in the first plurality of fin structures 10 that are present on the substrate 5. The pitch P1 separating adjacent fin structures 10 may range from 35 nm to 45 nm. In another example, the pitch P1 separating adjacent fin structures 10 may range from 30 nm to 40 nm. It is noted that the above examples for pitch are provided for illustrative purposes only, and that any pitch may be used with the methods and structures of the present disclosure including a pitch P1 below 30 nm.

The height H2 of the fin structures in the second plurality of fin structures 15 is measured from the upper surface of the portions of the semiconductor substrate 5 that have been recessed, and the height of the fin structures in the first plurality of fin structures 15 is generally greater than the height of the fin structures in the first plurality of fin structures 10. In one embodiment, each of the plurality of fin structures 15 has a height H2 ranging from 10 nm to 100 nm. In one example, each of the plurality of fin structures 15 has a height H2 ranging from 20 nm to 50 nm. Each of the plurality of fin structures 15 may have a width W2 of less than 20 nm. In another embodiment, each of the plurality of fin structures 15 has a width W2 ranging from 3 nm to 8 nm. Although only one fin structure are depicted in FIG. 1, the present disclosure is not limited to only this example. It is noted that any number of fin structures 15 may be in the first plurality of fin structures 15 that are present on the substrate 5. The pitch P2 separating adjacent fin structures 15 in the second plurality of fin structures 15 may range from 10 nm to 500 nm. In another example, the pitch P2 separating adjacent fin structures in the second plurality of fin structures 15 may range from 20 nm to 100 nm.

Still referring to FIG. 1, in some embodiments, the space between the adjacent fin structures 10, 15 is filled with at least one dielectric material 30a, 30b, 31 that provides for device isolation between adjacent fin structures 10, 15. Forming the at least one dielectric material 30a, 30b, 31 may begin with forming a liner dielectric 31 on the surfaces of the fin structures 10, 15, and the recessed surface of the semiconductor layer 6 and the substrate 5. The liner dielectric 31 may be composed of a nitride, oxide or oxynitride material. In some embodiments, the liner dielectric may be composed of silicon oxide or silicon nitride. The liner dielectric 31 is typically formed using a conformal deposition process. The term "conformal" denotes a layer having a thickness that does not deviate from greater than or less than 30% of an average value for the thickness of the layer. The liner dielectric 31 may be formed using a deposition process, such as chemical vapor deposition, or the liner dielectric 31 may be formed using a growth process, such as thermal oxidation.

Still referring to FIG. 1, after forming the liner dielectric 31, a first dielectric material 30a, 30b is deposited filling the space between adjacent fin structures 10, 15. The first dielectric material 30a, 30b may be composed of a nitride, oxide, oxynitride material, and/or any other suitable dielectric layer. For example, when the first dielectric material 30a, 30b is composed of an oxide, the first dielectric material 30a, 30b can be silicon oxide ($SiO_2$). In another example, when the first dielectric material 30a, 30b is composed of a nitride, the dielectric regions can be silicon nitride. The first dielectric material 30a, 30b can be formed by a deposition process, such as CVD. Variations of CVD processes include, but not limited to, Atmospheric Pressure CVD (APCVD), Low Pressure CVD (LPCVD) and PECVD, Metal-Organic CVD (MOCVD) and combinations thereof. Alternatively, the first dielectric material 30a, 30b may be deposited using spin on deposition, and deposition from solution.

Figure 2:
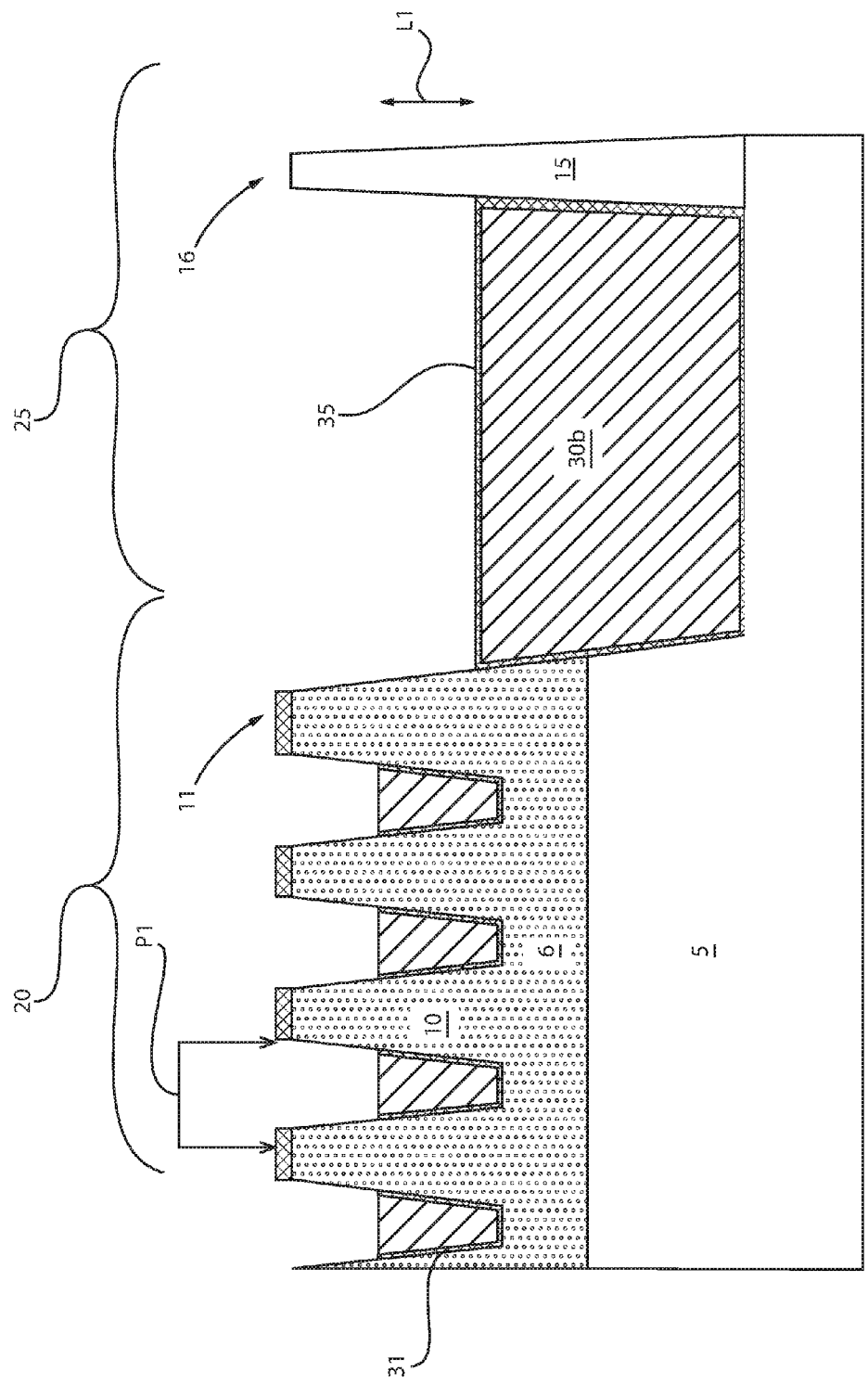
FIG. 2 is a side cross-sectional view depicting recessing the first dielectric material separating adjacent fin structures, wherein a portion of first dielectric material that is recessed in the first device region has an upper surface offset from the portion of the first dielectric material that is recessed in the second device region, in accordance with one embodiment of the present disclosure.

FIG. 2 depicts one embodiment of recessing the first dielectric material 30a, 30b separating adjacent fin structures 10, 15, wherein a portion of first dielectric material 30a that is recessed in the first device region 20 has an upper surface offset from the portion of the first dielectric material 30b that is recessed in the second device region 25. It is noted that the portion of the first dielectric material 30b that is present in the second region 25 of the substrate that is separating the second plurality of fin structures 15, which are separated by the greater pitch, i.e., a looser pitched/less dense plurality of fin structures, than the first plurality of fin structures 10 in the first region 20 is etched at a greater rate than the portion of the first dielectric material 30b that is present in the first region 20 of the substrate 5 between the adjacent fin structures in the tighter pitched/greater density first plurality of fin structures 10. This results in a vertical offset L1 between the recessed upper surface of the first dielectric material 30a in the first device region 20 of the substrate 5 and the recessed upper surface of the second dielectric material 30b in the second device region 25 of the substrate 5. The vertical offset L1 may range from 5 nm to 100 nm. In other embodiments, the vertical offset L1 may range from 100 nm to 1 micron.

The first dielectric material 30a, 30b may be recessed using a selective etch process to provide an exposed portion, i.e., reveal portion, of the upper portion of the fin structures 15, 20. In some embodiments, the dielectric regions are removed by an etch that is selective to the dielectric cap 11, 16 that is present on the fin structures 15, 20. The etch process may also remove the dielectric liner 31. In some embodiments, this can be done using hot phosphorus. In this example, the etch process for recessing the first dielectric material 30a, 30b may be selective to the fin structures 10, 15. The etch process for recessing the first dielectric material 30a, 30b may be an anisotropic etch or an isotropic etch. In some examples, the etch process may be a wet chemical etch, reactive ion etch (RIE), plasma etch, laser etch and combinations thereof.

Figure 3:
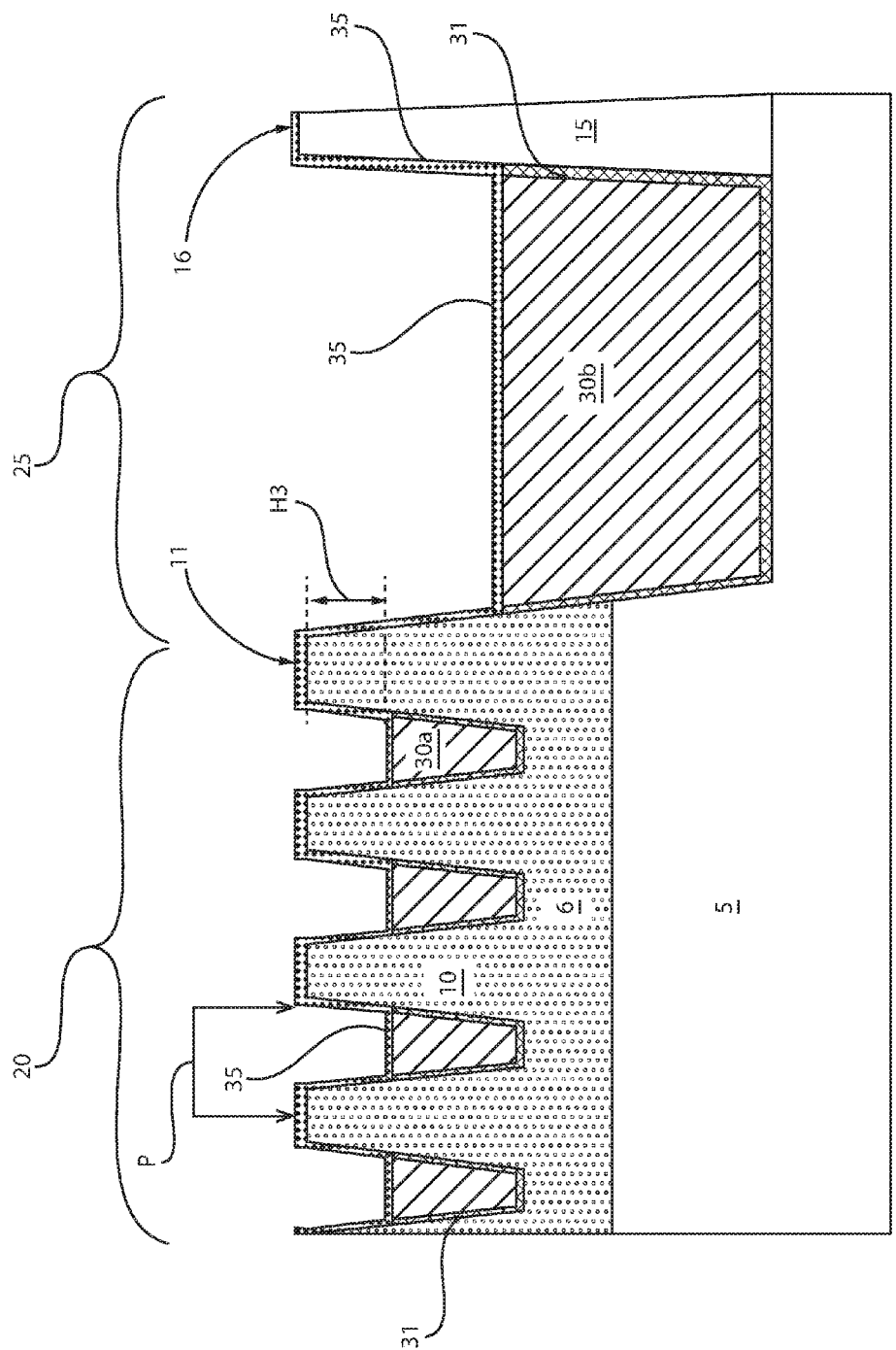
FIG. 3 is a side cross-sectional view depicting forming a first conformal etch stop layer on exposed surfaces of the first plurality of fin structures and the second plurality of fin structures as well as the offset upper surfaces of the first and second portions of the first dielectric material, in accordance with one embodiment of the present disclosure.

FIG. 3 depicts forming a first etch stop layer 35 on the surfaces of the first plurality of fin structures 10 and the second plurality of fin structures 15 as well as the offset upper surfaces of the first and second portions of the first dielectric material 30a, 30b. The first etch stop layer 35 may be a conformal layer. The first etch stop layer 35 can help to define the fin reveal height H3 in the first region 20 of the substrate 5, in which the first plurality of fin structures 10 having a tight pitch P1 (high density) is present. The first etch stop layer 35 can also provide an interlevel dielectric layer (ILD) etch stop layer for recess control in downstream processes.

In some embodiments, the first etch stop layer 35 is composed of a nitride dielectric, such as silicon nitride. It is noted that this is only one example of a composition that is suitable for the first etch stop layer 35. The first etch stop layer 35 may be composed of any dielectric layer that can protect, via selective etch resistance, the underlying first dielectric material 30a in the first device region 20 during subsequent processing of semiconductor devices using the first plurality of fin structures 10. The first etch stop layer 35 may be deposited using chemical vapor deposition. The first etch stop layer 35 is typically formed using a conformal deposition process. Suitable examples of chemical vapor deposition for forming the first etch stop layer 35 include plasma enhanced chemical vapor deposition (PECVD) and high density plasma chemical vapor deposition (HDPCVD). The first etch stop layer 35 typically has a thickness ranging from 1 nm to 10 nm. In some embodiments, the first etch stop layer 35 has a thickness ranging from 2 nm to 5 nm.

Figure 4:
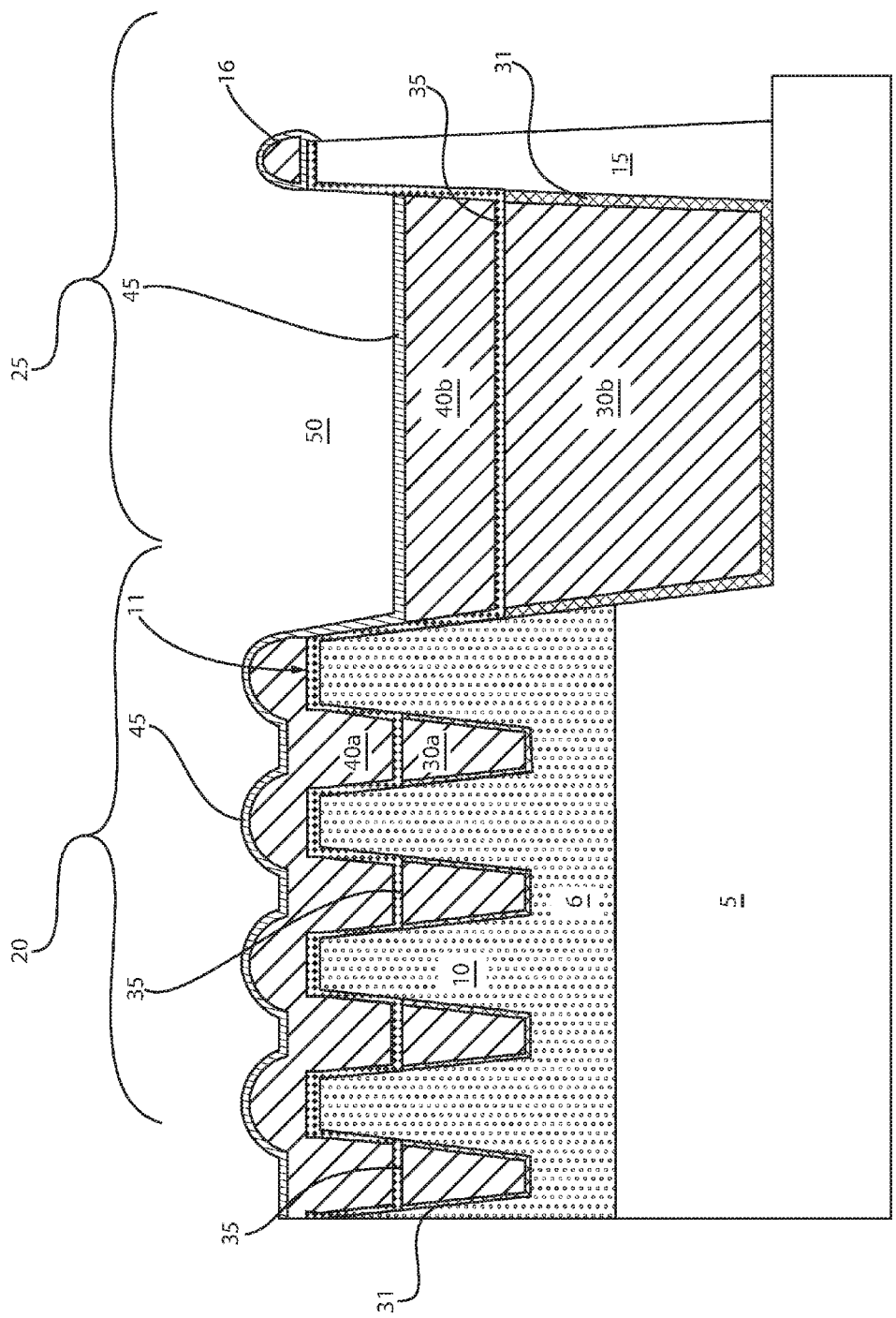
FIG. 4 is a side cross-sectional view depicting one embodiment of depositing a second dielectric material atop the first conformal etch stop layer, and forming a second etch stop layer on the second dielectric material, wherein a portion of the second dielectric material present in the second region of the substrate has an upper surface substantially coplanar with an upper surface of the first conformal etch stop layer in the first region of the substrate, in accordance with one embodiment of the present disclosure.

FIG. 4 depicts one embodiment of depositing a second dielectric material 40a, 40b atop the first etch stop layer 35, and forming a second etch stop layer 45 on the second dielectric material 40. In some embodiments, the portion of the second etch stop layer 45 that is present in the second region 25 of the substrate 5 provides an interlevel dielectric (ILD) oxide recess stop control layer, which controls the recess depth of the dielectric material separating the adjacent fin structures in the second plurality of fin structures 15. The upper surface of the second etch stop layer 45 in the second region 25 of the substrate 5 is substantially coplanar with the upper surface of the first etch stop layer 35 in the first region 20. When the upper surface of the fin structures 10 in the first region 20 is coplanar with the upper surface of the fin structures 15 in the second region 25, the coplanar first and second etch stop layers 35, 45 provide a grouping of etch stops that provide a uniform reveal height for the first plurality of fin structures 10 and the second plurality of fin structures 15.

The second dielectric material 40a, 40b is similar to the first dielectric material 30a, 30b. The first dielectric material 40a, 40b may be composed of a nitride, oxide, oxynitride material, and/or any other suitable dielectric layer. For example, when the second dielectric material 40a, 40b is composed of an oxide, the second dielectric material 40a, 40b can be silicon oxide (SiO$_2$). In another example, when the second dielectric material 40a, 40b is composed of a nitride, the dielectric regions can be silicon nitride. The second dielectric material 40a, 40b can be formed by a deposition process, such as CVD. Variations of CVD processes include, but not limited to, Atmospheric Pressure CVD (APCVD), Low Pressure CVD (LPCVD) and PECVD, Metal-Organic CVD (MOCVD) and combinations thereof. Alternatively, the second dielectric material 40a, 40b may be deposited using spin on deposition, and deposition from solution.

The deposition process for forming the second dielectric material 40a, 40b continues until the portion of the second dielectric layer 40b that is present in the second region 25 has an upper surface that is substantially coplanar with the upper surface of the portion of the first etch stop layer 35 in the first region 20.

In some embodiments, the second etch stop layer 45 is composed of a nitride dielectric, such as silicon nitride. It is noted that this is only one example of a composition that is suitable for the second etch stop layer 45. The second etch stop layer 45 may be composed of any dielectric layer that can protect, via selective etch resistance, the underlying second dielectric material 40b in the second device region 25 during subsequent processing of semiconductor devices using the second plurality of fin structures 15. The second etch stop layer 45 may be deposited using chemical vapor deposition. The second etch stop layer 45 is typically formed using a conformal deposition process. Suitable examples of chemical vapor deposition for forming the second etch stop layer 45 include plasma enhanced chemical vapor deposition (PECVD) and high density plasma chemical vapor deposition (HDPCVD). The second etch stop layer 45 typically has a thickness ranging from 1 nm to 10 nm. In some embodiments, the second etch stop layer 45 has a thickness ranging from 2 nm to 5 nm.

Figure 5:
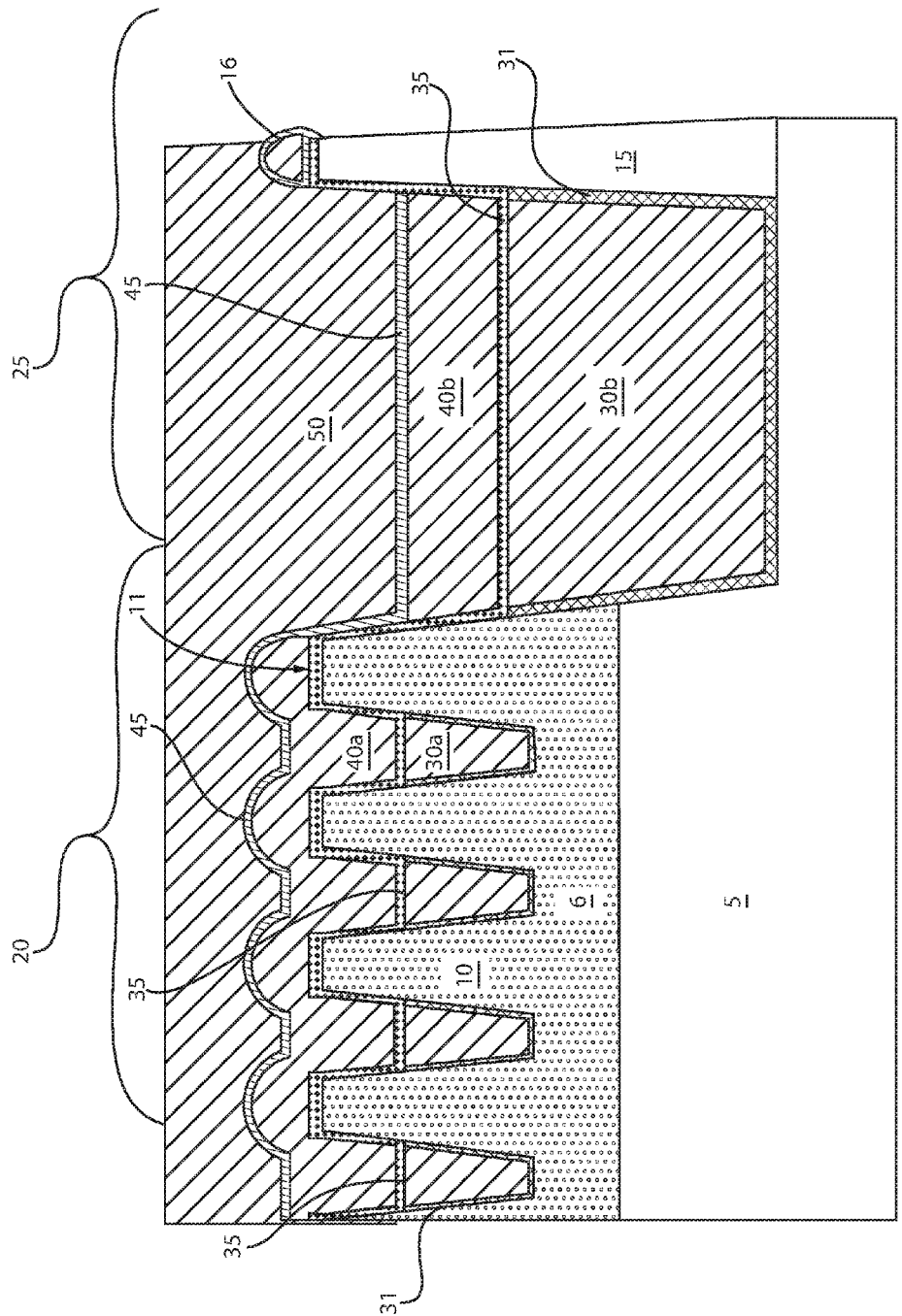
FIG. 5 is a side cross-sectional view depicting forming at least one third dielectric material layer on the second conformal etch stop layer, in accordance with one embodiment of the present disclosure.

FIG. 5 depicts forming at least one third dielectric material layer 50 on the second etch stop layer 45. The third dielectric material 50 may be composed of a nitride, oxide, oxynitride material, and/or any other suitable dielectric layer. For example, when the third dielectric material 50 is composed of an oxide, the third dielectric material 50 can be silicon oxide (SiO$_2$). In another example, when the third dielectric material layer 50 is composed of a nitride, the dielectric regions can be silicon nitride. The third dielectric material layer 50 can be formed by a deposition process, such as CVD. Variations of CVD processes include, but not limited to, Atmospheric Pressure CVD (APCVD), Low Pressure CVD (LPCVD) and PECVD, Metal-Organic CVD (MOCVD) and combinations thereof. Alternatively, the third dielectric material layer 50 may be deposited using spin on deposition, and deposition from solution. The thickness of the at least one third dielectric material layer 50 is selected so that the upper surface of the at least one third dielectric material layer 50 is substantially coplanar with the upper surfaces of the first and second plurality of fin structures 15, 20. The thickness of the third dielectric material layer 50 can be over deposited to extend above the upper surfaces of the first and second plurality of fin structure 15, 25, as depicted in FIG. 5

Figure 6:
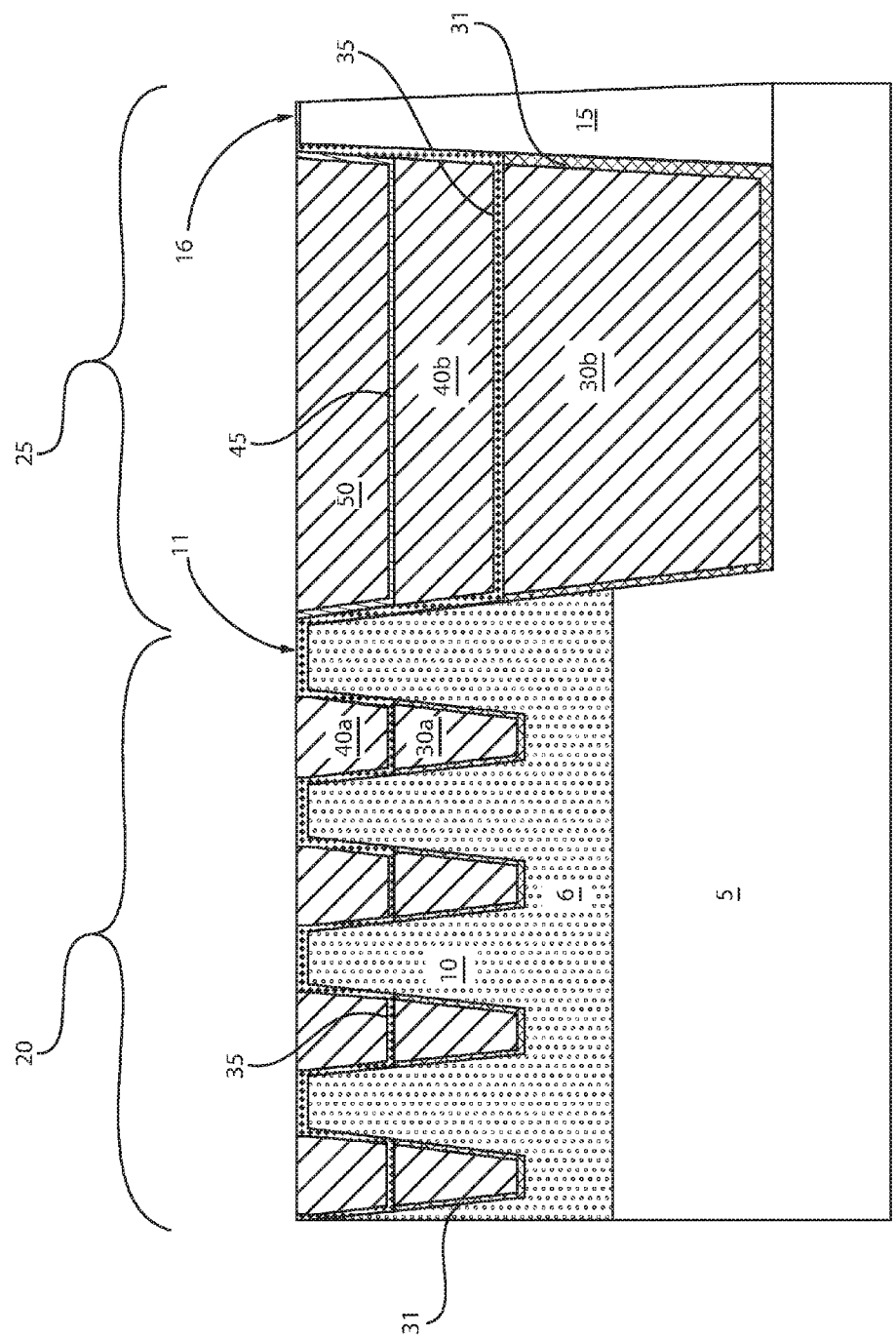
FIG. 6 is a side cross-sectional view depicting one embodiment of planarizing the dielectric material layer and stop on the hardmask.

FIG. 6 depicts one embodiment of planarizing the at least one third dielectric material layer 50 that is depicted in FIG. 5 so that the upper surfaces of the planarized third dielectric material layer 50, and the first and second plurality of fin structures are substantially coplanar. The planarization process may be provided by chemical mechanical planarization (CMP). Other planarization process may include grinding and polishing.

Figure 7:
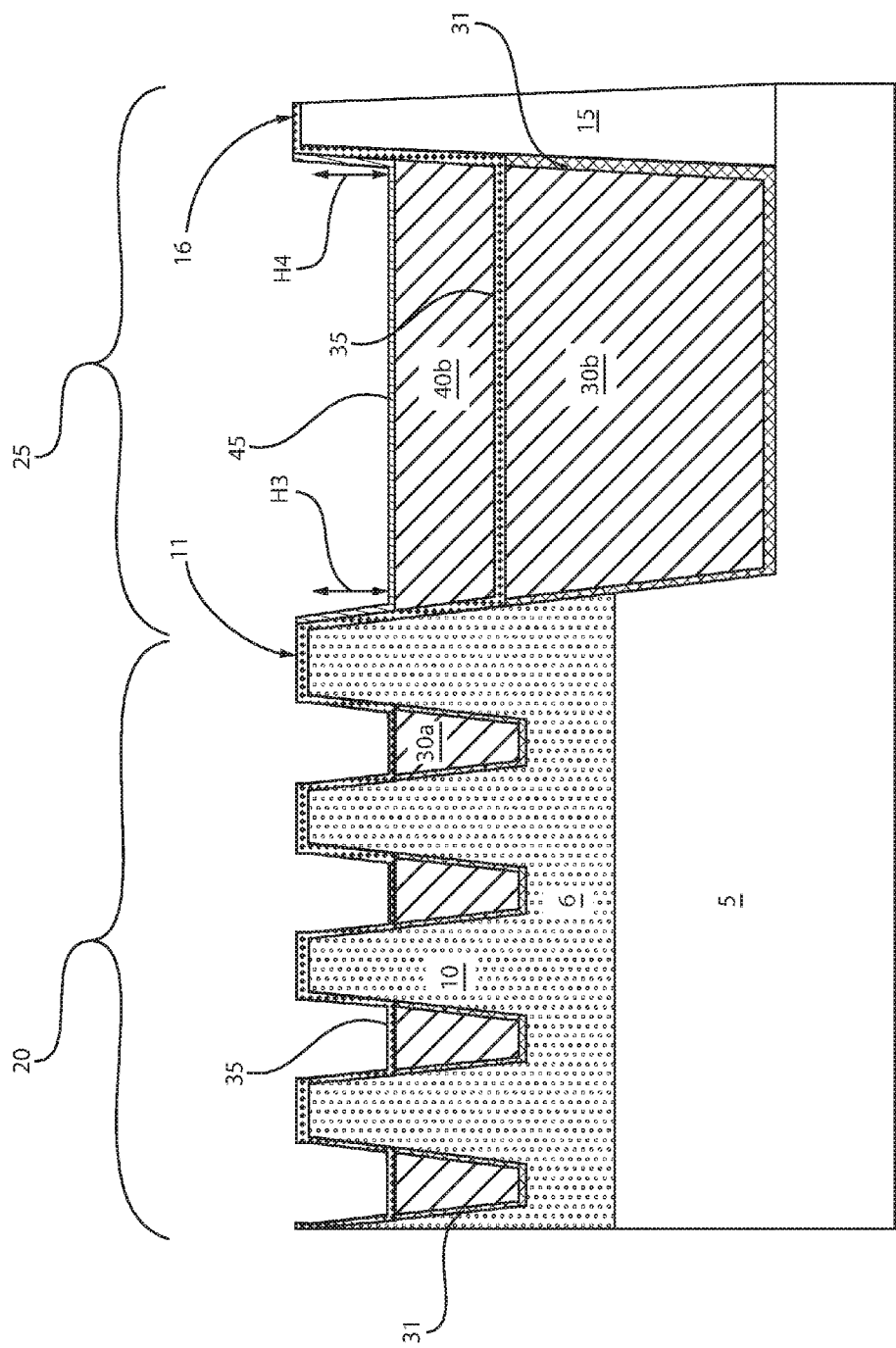
FIG. 7 is a side cross-sectional view depicting recessing the dielectric material and stop on the first conformal layer using an etch that is selective to the first conformal etch stop layer and the second conformal etch stop layer, wherein a portion of the fin structures in the first plurality of fin structures that is revealed by the recess etch is substantially equal to a portion of the fin structures in the second plurality of fin structures that is revealed by the recess etch, in accordance with one embodiment of the present disclosure.

FIG. 7 depicts one embodiment of recessing the at least one third dielectric material layer 50 using an etch that is selective to the first etch stop layer 35 and the second etch stop layer 45, wherein a portion H3 of the fin structures 10 in the first plurality of fin structures 10 that is revealed by the recess etch is substantially equal to a portion H4 of the fin structures 15 in the second plurality of fin structures 15 that is revealed by the recess etch.

As used herein, the term "selective" in reference to a material removal process denotes that the rate of material removal for a first material is greater than the rate of removal for at least another material of the structure to which the material removal process is being applied. For example, in one embodiment, a selective etch may include an etch chemistry that removes a first material selectively to a second material by a ratio of 10:1 or greater, e.g., 100:1 or greater, or 1000:1 or greater.

In one embodiment, the high-k dielectric fin liner 25 that is present in the first device region 15 is removed by an etch that is selective to at least the fin structures 10 and the block mask 30. In some embodiments, when the third dielectric material layer 50 is composed of an oxide, such as silicon oxide, and the first etch stop layer 35 and the second etch stop layer 45 are composed of a nitride, such as silicon nitride, the selective etch may remove the oxide material without significantly damaging the nitride material. The etch process for recessing the third dielectric material 50 may be an anisotropic etch, such as reactive ion etch, or an isotropic etch, such as a wet chemical etch.

Figure 8:
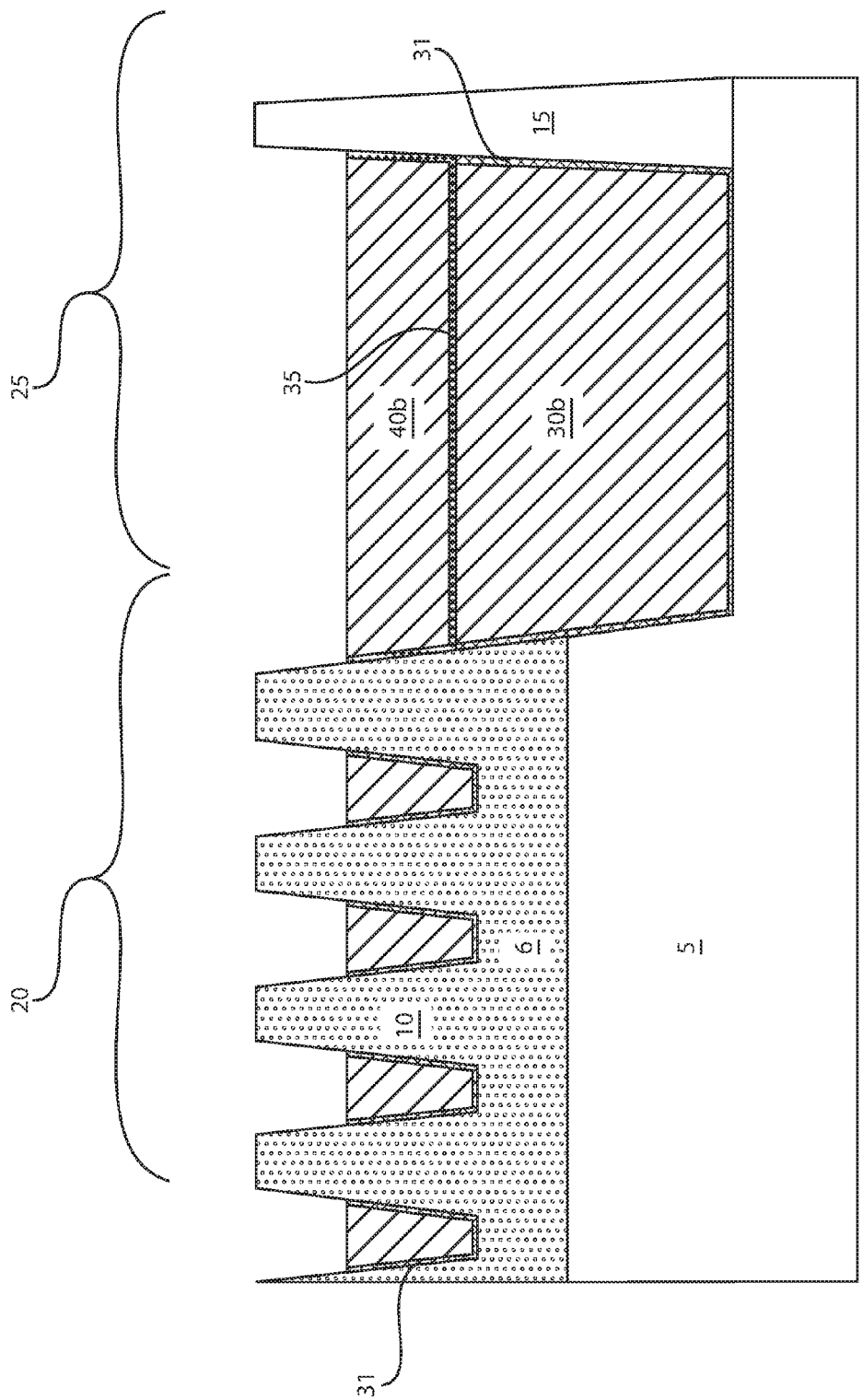
FIG. 8 is a side cross-sectional view depicting removing the exposed portion of the first and second etch stop layers, in accordance with one embodiment of the present disclosure.

FIG. 8 depicts one embodiment of removing the exposed portion of the first and second etch stop layers 35, 45. In some embodiments, the first and second etch stop layers 35, 45 are removed by an etch that is selective to the fin structures 10, 15. The etch process for removing the first and second etch stop layer 35, 45 may also remove the dielectric caps 11, 16 that are present on the first and second plurality of fin structures 10, 15. The etch process for recessing the third dielectric material 50 may be an anisotropic etch, such as reactive ion etch, or an isotropic etch, such as a wet chemical etch.

Following removal of the first and second etch stop layers 35, 45, the first plurality of fin structures 10 and the second plurality of fin structures 15 may be further processed to provide semiconductor devices. The portion (also referred to as first revealed portion) of the first plurality of fin structures 10 extending above the remaining portion of the first dielectric material 30a in the first device region 10 is substantially equal to the portion (also referred to as second revealed portion) of the second plurality of fin structures 15 extending above the remaining portion of the second dielectric material 40b in the second device region 25. For example, the height H3 of the first reveal portion for the first fin structures 10 is equal to the height H4 of the second reveal portion for the second fin structures 15, in which the height H3, H4 of the first and second reveal portion may each ranging from 50 nm to 100 nm. In another example, the height H3 of the first reveal portion for the first fin structures 10 is equal to the height H4 of the second reveal portion for the second fin structures 15, in which the height H3, H4 of the first and second reveal portion may each ranging from 10 nm to 50 nm.

It is noted that the embodiment that is described with reference to FIGS. 1-8 is only one embodiment of the present disclosure and it is not intended that the present disclosure be limited to only this disclosure. For example, FIGS. 9-15 illustrate another embodiment of the present disclosure, in which the first etch stop layer 35 is removed from the portion of the substrate that includes the less dense/greater pitched fin structures, i.e., the second region 25 of the substrate 5.

Figure 9:
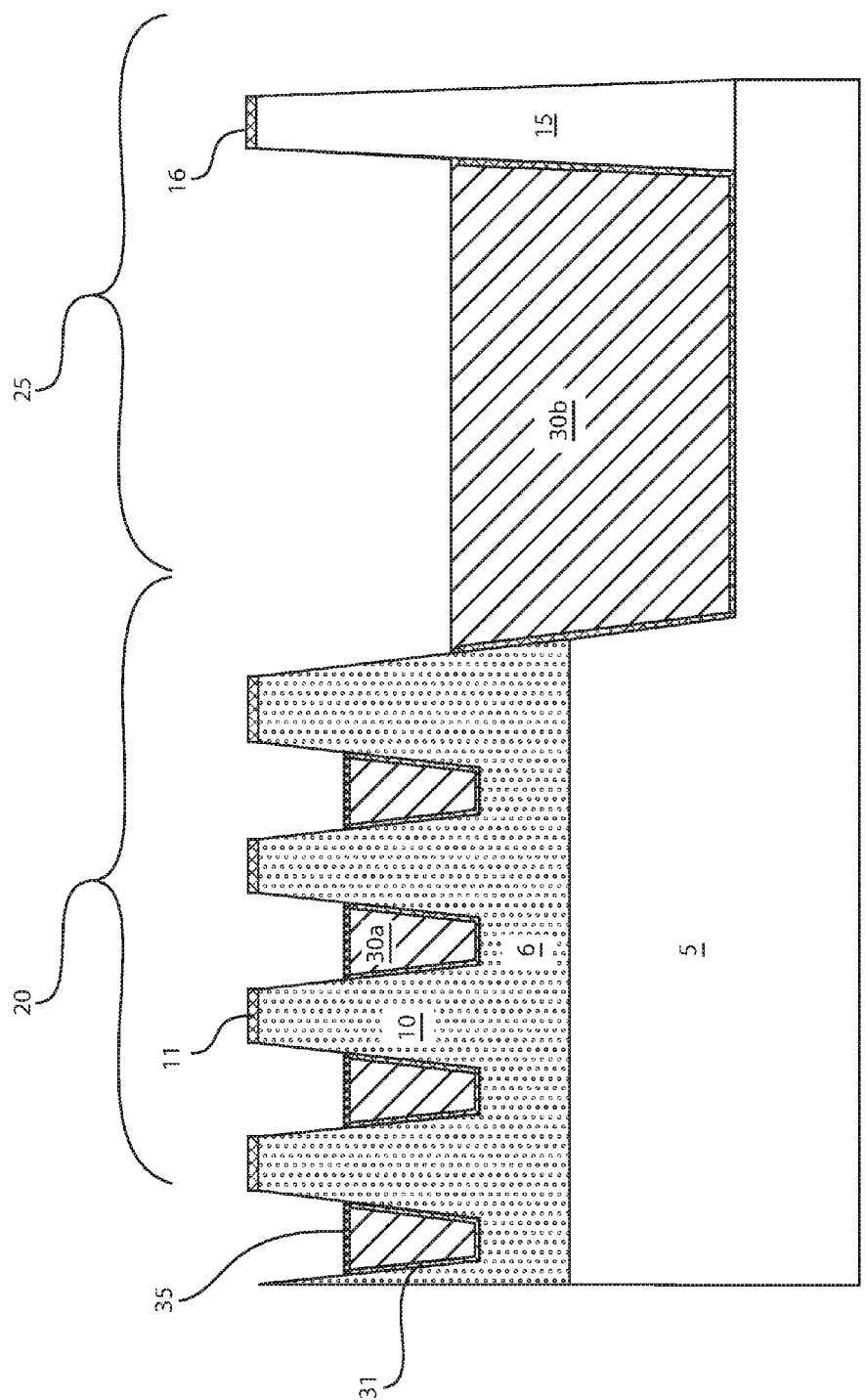
FIG. 9 is a side cross-sectional view of a removing the first etch stop layer 35 from the second region 30 of the substrate 5 that is depicted in FIG. 4, in accordance with one embodiment of the present disclosure.

FIG. 9 depicts one embodiment of removing the first etch stop layer 35 from the second region 25 of the substrate 5 that is depicted in FIG. 4. The first etch stop layer 35 remains in the first region 20 of the substrate 5. To provide that the first etch stop layer 35 is only removed from the second region 25 of the substrate 5, an etch mask, such as a photoresist mask (not shown) may be formed over the first region 20 of the substrate 5, and the portion of the first etch stop layer 35 that is exposed in the second region 25 is removed using an etch that is selective to the photoresist mask and the first dielectric material 30b. The etch mask may be formed using deposition, photolithography and development process steps. After removing the portion of the first etch stop layer 35 from the second region 25 of the substrate, the etch mask, e.g., photoresist mask, may be removed.

Figure 10:
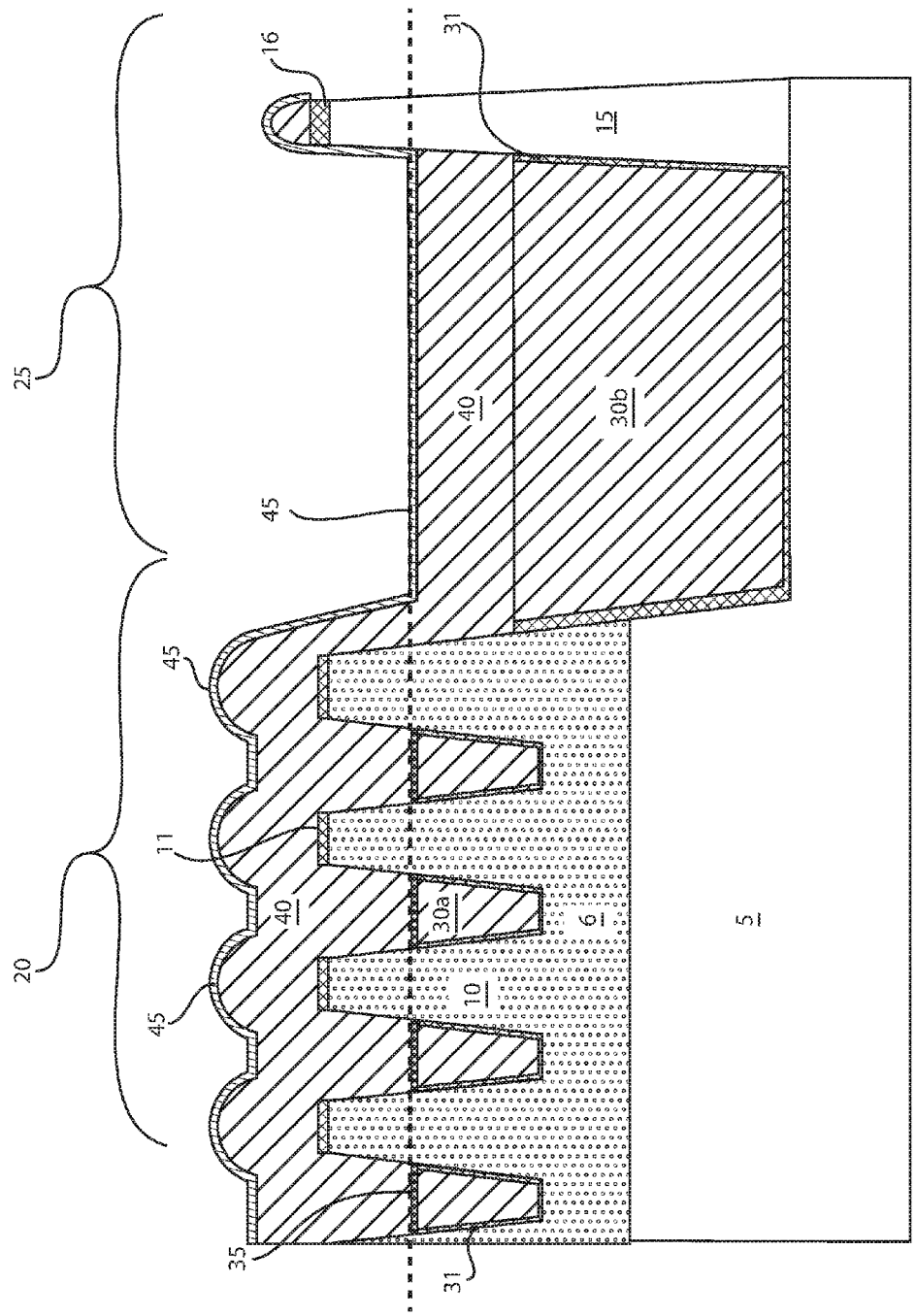
FIG. 10 is a side cross-sectional view depicting one embodiment of depositing a second dielectric material in the first region and the second region of the structure depicted in FIG. 9, and forming a second conformal etch stop layer on the second dielectric material, wherein a portion of the second dielectric material present in the second region of the substrate has an upper surface substantially coplanar with an upper surface of the first conformal etch stop layer in the first region of the substrate, in accordance with one embodiment of the present disclosure.

FIG. 10 depicts one embodiment of depositing a second dielectric material 40 in the first region 20 and the second region 25 of the substrate 5 depicted in FIG. 9, and forming a second conformal etch stop layer 45 on the second dielectric material 40. The second dielectric material 40 that is depicted in FIG. 10 is similar to the second dielectric material 40a, 40b that is described above with reference to FIG. 4 with the exception that in the embodiment depicted in FIG. 10 the second dielectric material 40 is formed in direct contact with the portion of the first dielectric material 30b that is present in the second region 25 of the substrate 5. Therefore, the above description of the second dielectric material 40a, 40b that is described above with reference to FIG. 4 is suitable for describing at least one embodiment of the second dielectric material 40 that is depicted in FIG. 10. In one embodiment, the portion of the second dielectric material 40 that is present in the second region 20 of the substrate 5 has an upper surface substantially coplanar with an upper surface of the first etch stop layer 35 in the first region 20 of the substrate 5.

FIG. 10 also depicts forming a second etch stop layer 45 on the second dielectric material 40. The second etch stop layer 45 that is depicted in FIG. 10 is similar to the second etch stop layer 45 that is depicted in FIG. 4. Therefore, the above description of the second etch stop layer 45 that is described above with reference to FIG. 4 is suitable for describing at least one embodiment of the second etch stop layer 45 that is depicted in FIG. 10. In one embodiment, the portion of the second etch stop layer 45 that is present in the second region 20 of the substrate 5 has an upper surface substantially coplanar with an upper surface of the first etch stop layer 35 in the first region 20 of the substrate 5.

Figure 11:
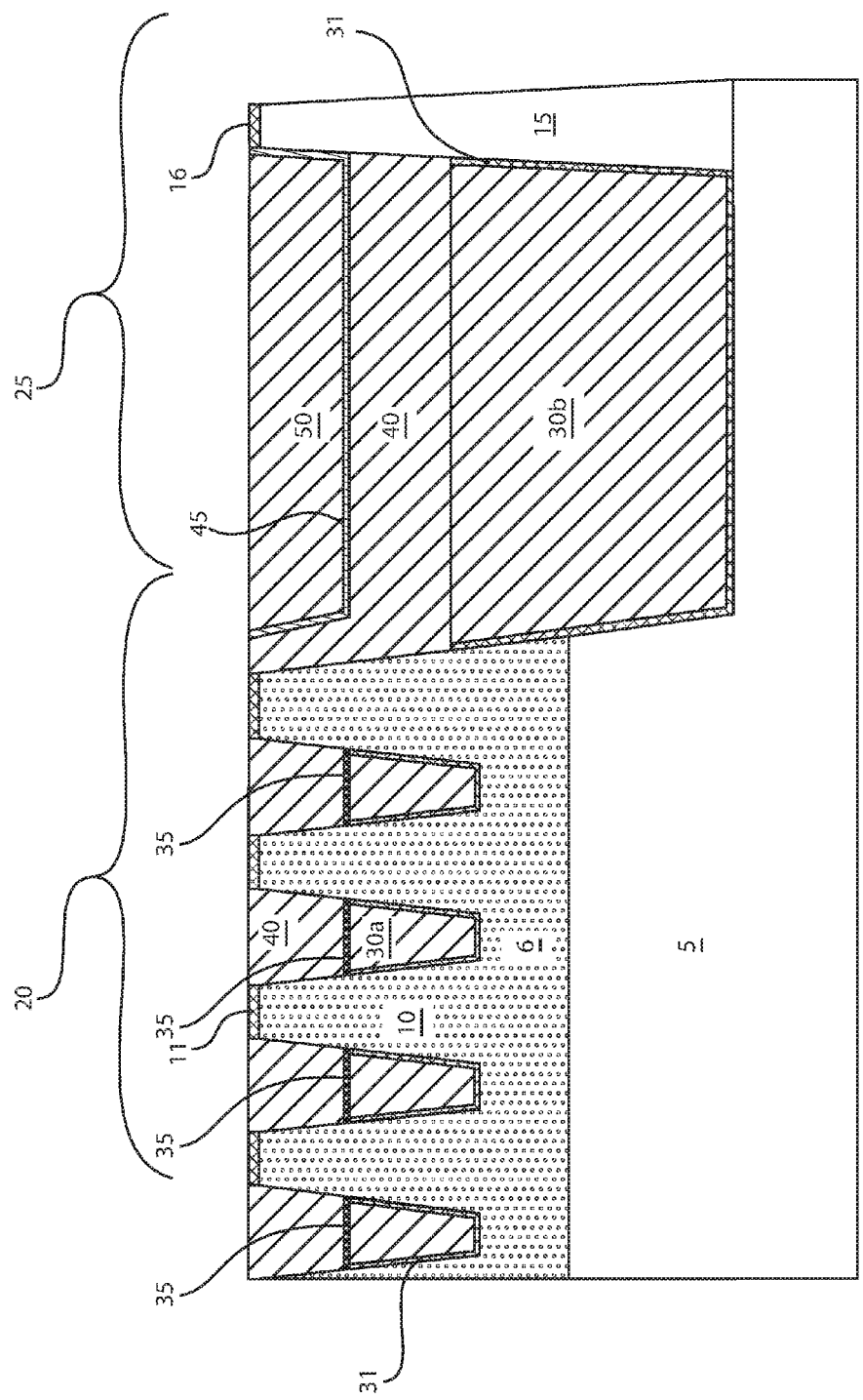
FIG. 11 is a side cross-sectional view depicting planarizing the structure depicted in FIG. 10.

FIG. 11 depicts one embodiment of depositing a third dielectric material 50 on the structure depicted in FIG. 10 followed by applying planarization step. The third dielectric material 50 is formed atop the second etch stop layer 45. The third dielectric material 50 may be composed of a nitride, oxide, oxynitride material, and/or any other suitable dielectric layer. For example, when the third dielectric material 50 is composed of an oxide, the third dielectric material 50 can be silicon oxide ($SiO_2$). In another example, when the third dielectric material layer 50 is composed of a nitride, the dielectric regions can be silicon nitride. The third dielectric material layer 50 can be formed by a deposition process, such as CVD. Variations of CVD processes include, but not limited to, Atmospheric Pressure CVD (APCVD), Low Pressure CVD (LPCVD) and PECVD, Metal-Organic CVD (MOCVD) and combinations thereof. Alternatively, the third dielectric material layer 50 may be deposited using spin on deposition, and deposition from solution. The thickness of the at least one third dielectric material layer 50 is selected so that the upper surface of the at least one third dielectric material layer 50 is substantially coplanar with the upper surfaces of the first and second plurality of fin structures 15, 20. The thickness of the third dielectric material layer 50 can be over deposited to extend above the upper surfaces of the first and second plurality of fin structure 15, 25.

FIG. 11 also depicts one embodiment of planarizing the at least one third dielectric material layer 50 so that the upper surfaces of the planarized third dielectric material layer 50, and the first and second plurality of fin structures 10, 15 are substantially coplanar. The planarization process may be provided by chemical mechanical planarization (CMP). Other planarization process may include grinding and polishing.

Figure 12:
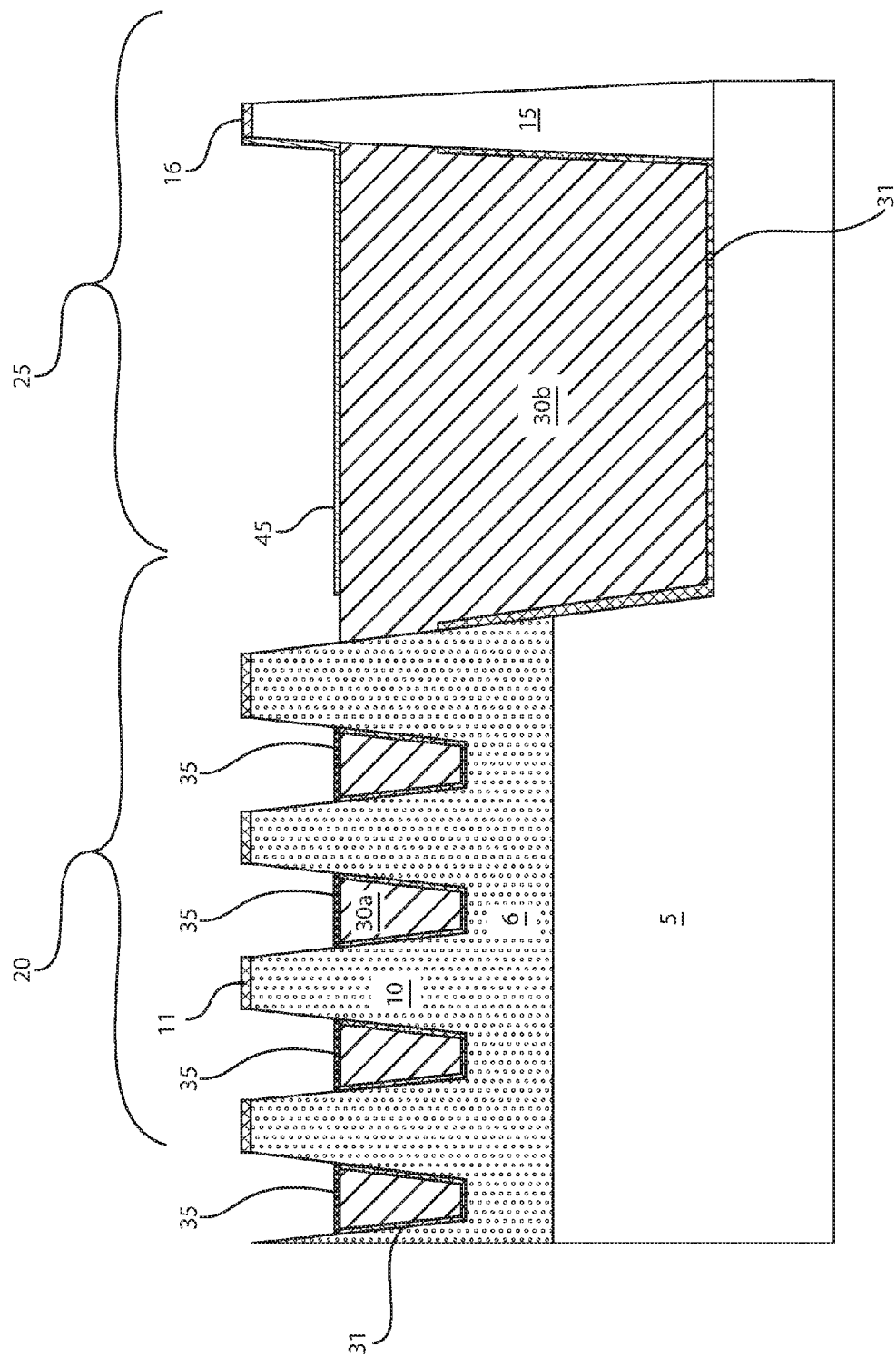
FIG. 12 is a side cross sectional view depicting recessing the dielectric material using an etch that is selective to the first conformal etch stop layer and the second conformal etch stop layer, wherein a portion of the fin structures in the first plurality of fin structures that is revealed by the recess etch is substantially equal to a portion of the fin structures in the second plurality of fin structures that is revealed by the recess etch, in accordance with one embodiment of the present disclosure.
Figure 13:
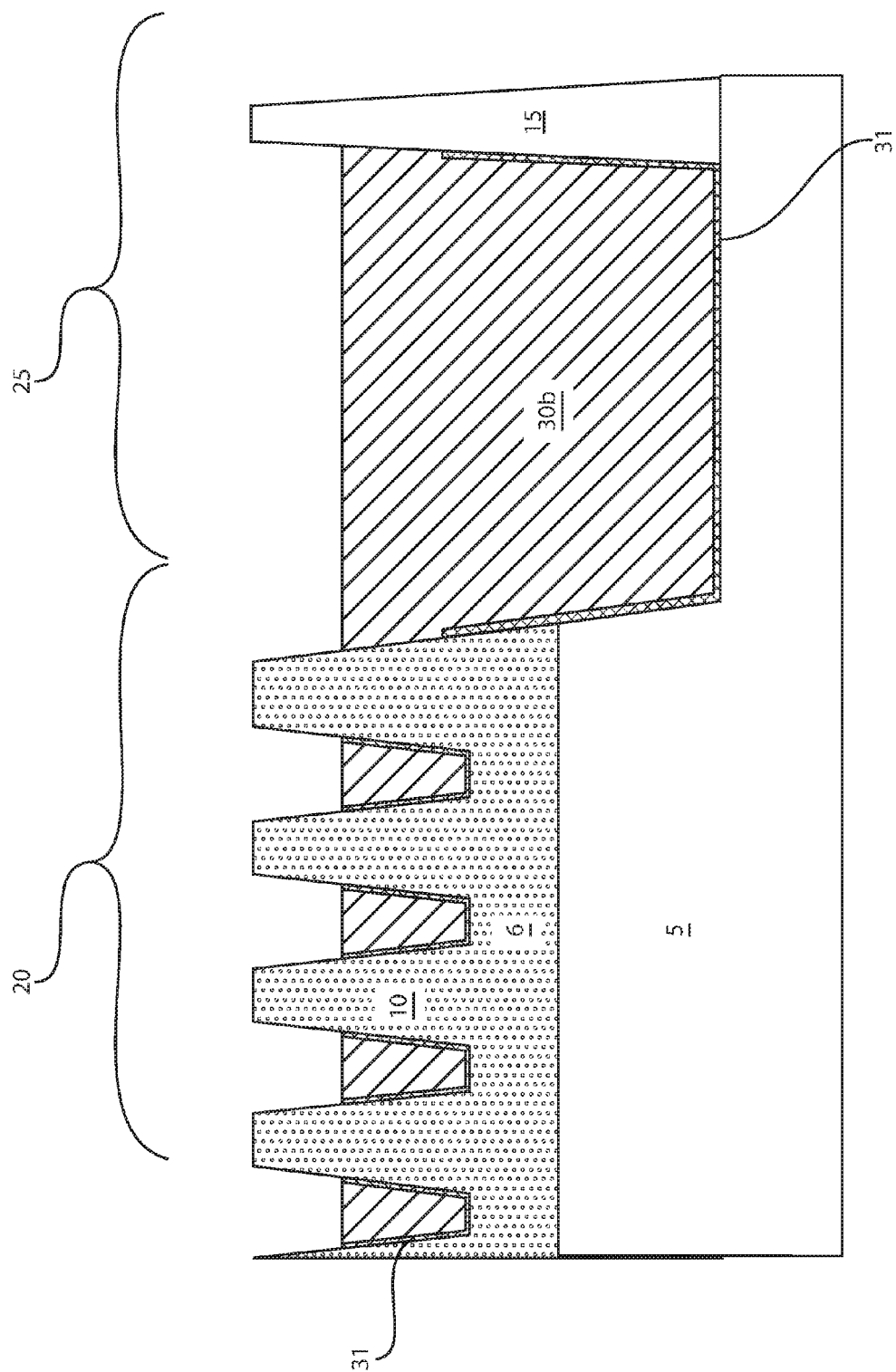
FIG. 13 is a side cross-sectional view depicting removing the first and second etch stop layers, in accordance with one embodiment of the present disclosure.

FIG. 12 depicts one embodiment removing the at least one third dielectric material 50 in the second region 25 and the portion of the second dielectric material 40a in the first region 20 using a recess etch that is selective to the first etch stop layer 35 and the second etch stop layer 45, wherein a portion of the fin structures in the first plurality of fin structures that is revealed by the recess etch is substantially equal to a portion of the fin structures in the second plurality of fin structures that is revealed by the recess etch. The recess etch that is depicted in FIG. 12 has been described above with reference to FIG. 8. Therefore, the recess etch that is described in FIG. 8 is suitable for describing at least one embodiment of the recess etch for revealing the fin structures that is depicted in FIG. 12. FIG. 13 depicts removing the exposed portions of the first and second etch stop layers 35, 45. The first and second etch stop layers 35, 45 may be removed by an etch that is selective to the fin structures 10, 15.

Following removal of the first and second etch stop layers 35, 45, the first plurality of fin structures 10 and the second plurality of fin structures 15 may be further processed to provide semiconductor devices. The portion (also referred to as first revealed portion) of the first plurality of fin structures 10 extending above the remaining portion of the first dielectric material 30a in the first device region 10 is substantially equal to the portion (also referred to as second revealed portion) of the second plurality of fin structures 15 extending above the remaining portion of the second dielectric material 40b in the second device region 25. For example, the height H3 of the first reveal portion for the first fin structures 10 is equal to the height H4 of the second reveal portion for the second fin structures 15, in which the height H3, H4 of the first and second reveal portion may each ranging from 50 nm to 100 nm. In another example, the height H3 of the first reveal portion for the first fin structures 10 is equal to the height H4 of the second reveal portion for the second fin structures 15, in which the height H3, H4 of the first and second reveal portion may each ranging from 10 nm to 50 nm.

Figure 14:
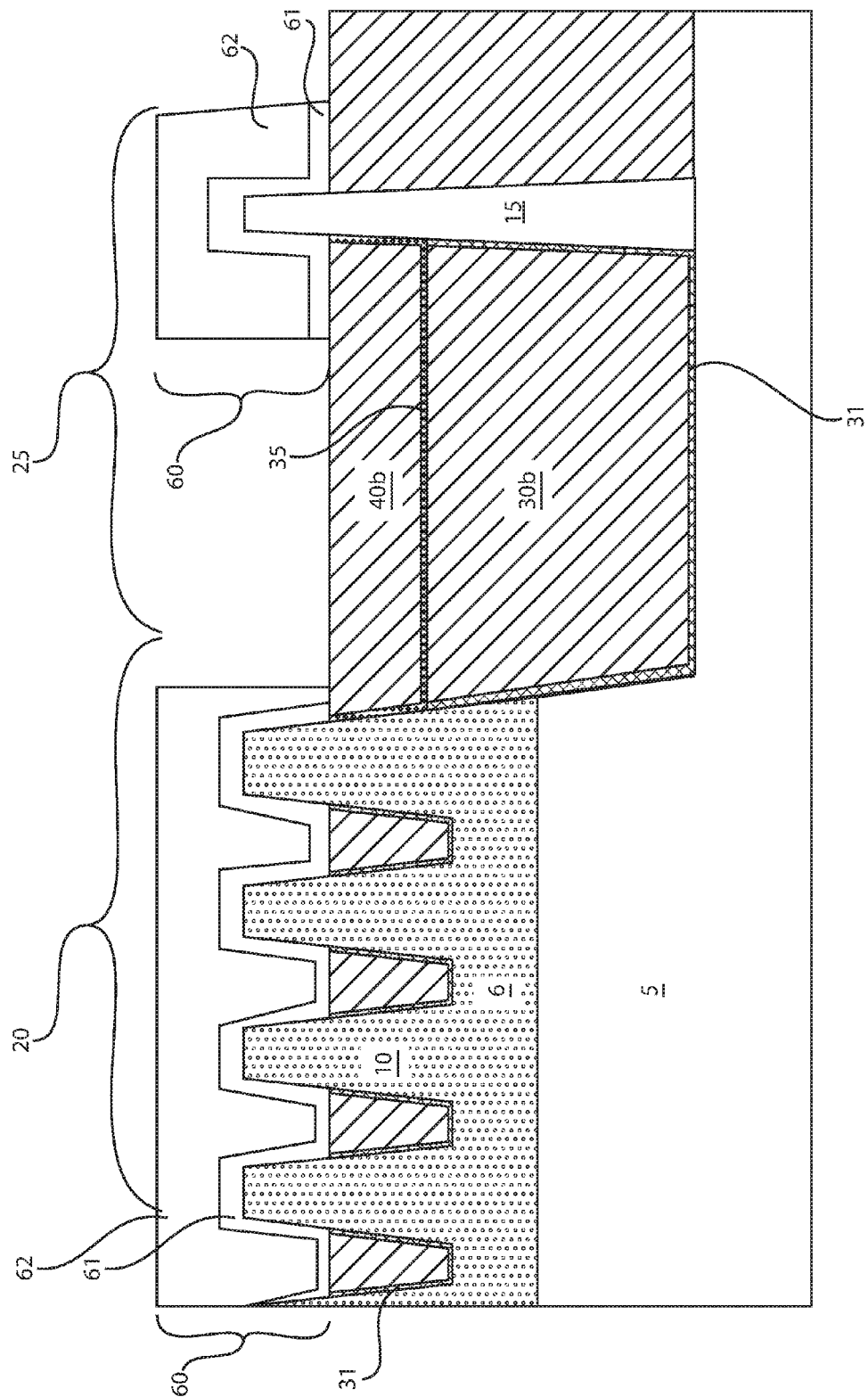
FIG. 14 is a side cross-sectional view depicting one embodiment of forming a gate structure on the channel region of the fin structures depicted in FIG. 7.

As noted above, the method for forming the fin structures 10, 15 depicted in FIGS. 1-13 can be used for forming FinFET semiconductor devices. To provide FinFET semiconductor devices for the fin structures 10, 15 formed using the method described with reference to FIGS. 1-13, the method may continue with forming a gate structure for each of the fin structures 10, 15 that will provide a semiconductor device. FIG. 14 depicts forming a gate structure 60 on the fin structures 10, 15 that are depicted in FIG. 7. It is noted that the gate structure 60 that is depicted in FIG. 14 as being formed on the fin structures 10, 15 depicted in FIG. 7 may equally be formed on the fin structures 10, 15 that are depicted in FIG. 13.

The "gate structure" functions to switch the semiconductor device from an "on" to "off" state, and vice versa. The gates structure 60 is formed on the channel region of the fin structures 10, 15. The gate structure 60 typically includes at least a gate dielectric 61 that is present on the channel region of the fin structure 10, 15 and a gate electrode 62 that is present on the gate dielectric 61. In one embodiment, the at least one gate dielectric layer 61 includes, but is not limited to, an oxide, nitride, oxynitride and/or silicates including metal silicates, aluminates, titanates and nitrides. In one example, when the at least one gate dielectric layer 61 is comprised of an oxide, the oxide may be selected from the group including, but not limited to, $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the at least one gate dielectric layer 61 may vary, but typically, the at least one gate dielectric layer 61 has a thickness from 1 nm to 10 nm. In another embodiment, the at least one gate dielectric layer 61 has a thickness from 1 nm to 3 nm.

The conductive material of the gate electrode 62 may comprise polysilicon, SiGe, a silicide, a metal or a metal-silicon-nitride such as Ta—Si—N. Examples of metals that can be used as the gate electrode 62 include, but are not limited to, Al, W, Cu, and Ti or other like conductive metals. The layer of conductive material for the gate electrode 62 may be doped or undoped. If doped, an in-situ doping deposition process may be employed. Alternatively, a doped conductive material can be formed by deposition, ion implantation and annealing. The gate structures may also be formed using sidewall image transfer (SIT).

Figure 15:
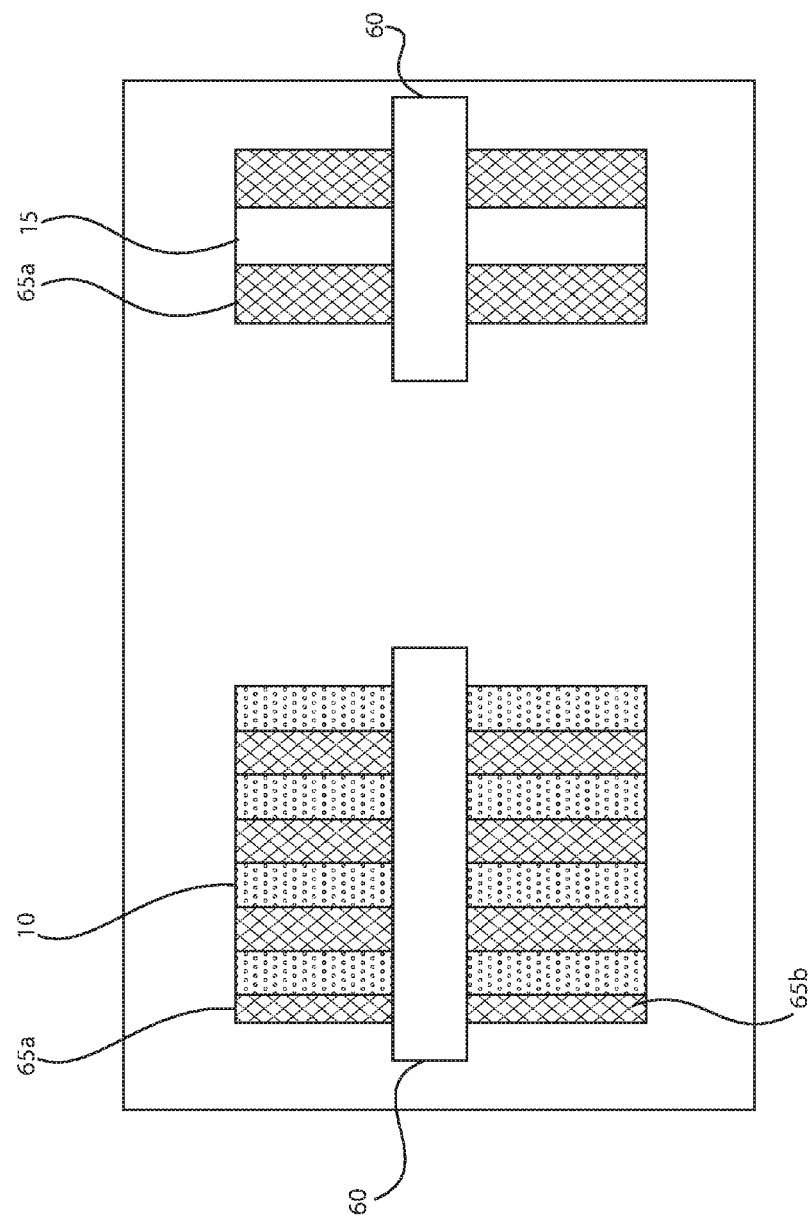
FIG. 15 is a top down view depicting forming source and drain regions on the source and drain portions of the fin structures that are on opposing sides of the gate structure.

FIG. 15 depicts one embodiment of forming source and drain regions 65a, 65b on the source and drain portions of the fin structures 10, 15 that are on opposing sides of the gate structure 60. Forming the source and drain regions 65a, 65b may include forming an in situ doped epitaxial semiconductor material on the source and drain region portions of the fin structures 10, 15. The term "epitaxial semiconductor material" denotes a semiconductor material that has been formed using an epitaxial deposition or growth process. "Epitaxial growth and/or deposition" means the growth of a semiconductor material on a deposition surface of a semiconductor material, in which the semiconductor material being grown has substantially the same crystalline characteristics as the semiconductor material of the deposition surface. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation. In some embodiments, the epitaxial deposition process is a selective deposition method, in which the epitaxial semiconductor material is formed only on semiconductor material deposition surfaces. The epitaxial deposition process will not form epitaxial semiconductor material on dielectric surfaces.

In some embodiments, the epitaxial semiconductor material that provides the source and drain regions 65a, 65b may be composed of silicon (Si), germanium (Ge), silicon germanium (SiGe), silicon doped with carbon (Si:C) or a combination thereof. In one example, the p-type source and drain regions are provided by silicon germanium (SiGe) epitaxial semiconductor material. In one embodiment, a number of different sources may be used for the epitaxial deposition of the epitaxial semiconductor material that provides the source and drain regions 65a, 65b. Examples of silicon including source gasses may include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium including source gasses for epitaxially forming the epitaxial semiconductor material of a germanium containing semiconductor include germane, digermane, halogermane, dichlorogermane, trichlorogermane, tetrachlorogermane and combinations thereof. Epitaxial deposition may be carried out in a chemical vapor deposition apparatus, such as a metal organic chemical vapor deposition (MOCVD) apparatus or a plasma enhanced chemical vapor deposition (PECVD) apparatus. The temperature for epitaxial deposition typically ranges from 550° C. to 900° C. Although higher temperature typically results in faster deposition, the faster deposition may result in crystal defects and film cracking.

The epitaxial semiconductor material that provides the source and drain regions 65a, 65b may be in situ doped to a p-type conductivity or an n-type conductivity. The term "in situ" denotes that a dopant, e.g., n-type or p-type dopant, is introduced to the base semiconductor material, e.g., silicon or silicon germanium, during the formation of the base material. For example, an in situ doped epitaxial semiconductor material may introduce p-type dopants to the material being formed during the epitaxial deposition process that includes p-type source gasses. As used herein, "p-type" refers to the addition of impurities to an intrinsic semiconductor that creates deficiencies of valence electrons. In a type IV semiconductor, such as silicon, examples of p-type dopants, i.e., impurities, include but are not limited to, boron, aluminum, gallium and indium. The p-type gas dopant source may include diborane ($B_2H_6$). In some embodiments, the epitaxial deposition process for forming the epitaxial semiconductor material for the source and drain regions 65a, 65b may continue until the epitaxial semiconductor material that is formed on adjacent fin structures contact one another to form merged epitaxial semiconductor material. As used herein, "n-type" refers to the addition of impurities that contributes free electrons to an intrinsic semiconductor. In a type IV semiconductor, such as silicon, examples of n-type dopants, i.e., impurities, include but are not limited to antimony, arsenic and phosphorous.

It is noted that the above process sequences describe a gate first process sequence for forming FinFETs. The present disclosure is not limited to only gate first processing. For example, gate last, which is also referred to as replacement gate processing, is also suitable for use with the methods and structures of the present disclosure. A gate last process can include forming a replacement gate structure on the channel portion of the fin structures, forming a spacer on the sidewall of the replacement gate structure, forming source and drain regions on opposing sides of the replacement gate structure, removing the replacement gate structure, and forming a functional gate structure in the space once occupied by the replacement gate structure. The replacement gate structure can include sacrificial material that defines the geometry of a later formed functional gate structure that functions to switch the semiconductor device from an "on" to "off" state, and vice versa. A process sequence employing a replacement gate structure may be referred to as a "gate last" process sequence. Both gate first and gate last process sequences are applicable to the present disclosure.

The methods and structures that have been described above with reference to FIGS. 1-21B may be employed in any electrical device including integrated circuit chips. The integrated circuit chips including the disclosed structures and formed using the disclosed methods may be integrated with other chips, discrete circuit elements, and/or other signal processing devices as part of either (a) an intermediate product, such as a motherboard, or (b) an end product. The end product can be any product that includes integrated circuit chips, including computer products or devices having a display, a keyboard or other input device, and a central processor.

Having described preferred embodiments of a methods and structures disclosed herein, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A semiconductor device comprising:
a first plurality of fin structures in a first device region and a second plurality of fin structures in a second device region, wherein the first plurality of fin structures includes adjacent fin structures separated by a lesser pitch than the adjacent fin structures in the second plurality of fin structures;
at least one layer of dielectric material between said adjacent fin structures in the first plurality of fin structures in the first device region and the second plurality of fin structures in the second device region, wherein a portion of the first plurality of fin structures extending above the at least one layer of dielectric material in the first device region is substantially equal to a portion of the second plurality of fin structures extending above the at least one layer of dielectric material in the second device region;
a gate structure on a channel region of at least one of said first plurality of fin structures and at least one of said second plurality of fin structures; and
source and drain regions on opposing sides of said gate structure.

2. The semiconductor device of claim 1, wherein the first plurality of fin structures are separated by a first pitch ranging from 10 nm to 100 nm.

3. The semiconductor device of claim 1, wherein the second plurality of fin structures are separated by a second pitch ranging from 100 nm to 1000 nm.

4. The semiconductor device of claim 1, wherein said at least one layer of dielectric material that is present between said adjacent fin structures in the second plurality of fin structures comprises a buried etch stop layer.

5. The semiconductor device of claim 4, wherein the buried etch stop layer comprises a nitride.

6. The semiconductor device of claim 1, wherein the second plurality of fin structures has a height that is greater than the first plurality of fin structures.

7. The semiconductor device of claim 6, wherein an upper surface of the second plurality of fin structures is substantially coplanar with an upper surface of the first plurality of fin structures.

8. A structure comprising:
a first plurality of fin structures in a first device region and a second plurality of fin structures in a second device region, wherein the first plurality of fin structures includes adjacent fin structures separated by a lesser pitch than the adjacent fin structures in the second plurality of fin structures; and
at least one layer of dielectric material between said adjacent fin structures in the first plurality of fin structures in the first device region and the second plurality of fin structures in the second device region, wherein a portion of the first plurality of fin structures extending above the at least one layer of dielectric material in the first device region is substantially equal to a portion of the second plurality of fin structures extending above the at least one layer of dielectric material in the second device region.

9. The structure of claim 8 further comprising a gate structure on a channel region of at least one of said first plurality of fin structures and at least one of said second plurality of fin structures.

10. The structure of claim 8, wherein the first plurality of fin structures are separated by a first pitch ranging from 10 nm to 100 nm.

11. The structure of claim 8, wherein the second plurality of fin structures are separated by a second pitch ranging from 100 nm to 1000 nm.

12. The structure of claim 8, wherein said at least one layer of dielectric material that is present between said adjacent fin structures in the second plurality of fin structures comprises an etch stop layer.

13. The structure of claim 12, wherein the etch stop layer comprises a nitride.

14. The structure of claim 8, wherein the second plurality of fin structures has a height that is greater than the first plurality of fin structures.

15. The structure of claim 8, wherein an upper surface of the second plurality of fin structures is substantially coplanar with an upper surface of the first plurality of fin structures.

16. A semiconductor device comprising:
a first plurality of fin structures in a first device region and a second plurality of fin structures in a second device region, wherein the first plurality of fin structures includes adjacent fin structures separated by a lesser pitch than the adjacent fin structures in the second plurality of fin structures, wherein an upper surface of the second plurality of fin structures is substantially coplanar with an upper surface of the first plurality of fin structures;
at least one layer of dielectric material between said adjacent fin structures in the first plurality of fin structures in the first device region and the second plurality of fin structures in the second device region, wherein a portion of the first plurality of fin structures extending above the at least one layer of dielectric material in the first device region is substantially equal to a portion of the second plurality of fin structures extending above the at least one layer of dielectric material in the second device region;
a gate structure on a channel region of at least one of said first plurality of fin structures and at least one of said second plurality of fin structures; and
source and drain regions on opposing sides of said gate structure.

17. The semiconductor device of claim 16, wherein the first plurality of fin structures are separated by a first pitch ranging from 10 nm to 100 nm.

18. The semiconductor device of claim 17, wherein the second plurality of fin structures are separated by a second pitch ranging from 100 nm to 1000 nm.

19. The semiconductor device of claim 16, wherein said at least one layer of dielectric material that is present between said adjacent fin structures in the second plurality of fin structures comprises an etch stop layer.

20. The semiconductor device of claim 19, wherein the etch stop layer comprises a nitride.

* * * * *